United States Patent
Toren et al.

(10) Patent No.: US 8,729,629 B2
(45) Date of Patent: May 20, 2014

(54) ENHANCED HVPMOS

(75) Inventors: Willem-Jan Toren, St. Maximin de la Sainte Baume (FR); Bruno Villard, Aix en Provence (FR); Elsa Hugonnard-Bruyere, Fuveau (FR); Gaetan Toulon, Toulouse (FR); Frederic Morancho, Ramonville Saint-Agne (FR); Ignasi Cortes Mayol, Saint Cugat del Valles (ES); Thierry Pedron, Bouc Bel Air (FR)

(73) Assignees: Atmel Rousset S.A.S., Rousset Cedez (FR); Laas-CNRS, Paris Cedex (FR)

( * ) Notice: Subject to any disclaimer, the term of this patent is extended or adjusted under 35 U.S.C. 154(b) by 8 days.

(21) Appl. No.: 13/539,033

(22) Filed: Jun. 29, 2012

(65) Prior Publication Data
US 2012/0267717 A1 Oct. 25, 2012

Related U.S. Application Data

(63) Continuation of application No. 12/851,256, filed on Aug. 5, 2010, now Pat. No. 8,217,452.

(51) Int. Cl.
*H01L 29/78* (2006.01)
*H01L 21/336* (2006.01)

(52) U.S. Cl.
USPC ............ 257/335; 257/347; 257/E29.012; 257/E21.427; 438/286; 438/294

(58) Field of Classification Search
USPC ............ 257/328, 335, 342, 347, 348, 352, 257/E27.111, E29.012, E29.061, E21.427; 438/151, 286, 294
See application file for complete search history.

(56) References Cited

U.S. PATENT DOCUMENTS

| | | | |
|---|---|---|---|
| 5,193,098 A * | 3/1993 | Welch et al. | 372/46.015 |
| 6,465,830 B2 | 10/2002 | Babcock et al. | |
| 6,753,575 B2 * | 6/2004 | Efland et al. | 257/343 |
| 7,151,296 B2 | 12/2006 | Wu et al. | |
| 7,262,471 B2 | 8/2007 | Pan et al. | |
| 7,468,537 B2 * | 12/2008 | Pendharkar | 257/335 |
| 7,888,216 B2 | 2/2011 | Chen et al. | |
| 8,217,452 B2 * | 7/2012 | Toren et al. | 257/335 |
| 8,258,042 B2 * | 9/2012 | Huang et al. | 438/418 |
| 2002/0017697 A1 | 2/2002 | Kitamura et al. | |
| 2009/0032868 A1 * | 2/2009 | Chen et al. | 257/336 |
| 2009/0167662 A1 * | 7/2009 | Kao et al. | 345/90 |
| 2010/0163990 A1 | 7/2010 | Ko | |
| 2011/0220995 A1 | 9/2011 | Chou et al. | |

* cited by examiner

*Primary Examiner* — Tuan N. Quach
(74) *Attorney, Agent, or Firm* — Fish & Richardson P.C.

(57) ABSTRACT

A p-channel LDMOS device with a controlled n-type buried layer (NBL) is disclosed. A Shallow Trench Isolation (STI) oxidation is defined, partially or totally covering the drift region length. The NBL layer, which can be defined with the p-well mask, connects to the n-well diffusion, thus providing an evacuation path for electrons generated by impact ionization. High immunity to the Kirk effect is also achieved, resulting in a significantly improved safe-operating-area (SOA). The addition of the NBL deep inside the drift region supports a space-charge depletion region which increases the RESURF effectiveness, thus improving BV. An optimum NBL implanted dose can be set to ensure fully compensated charge balance among n and p doping in the drift region (charge balance conditions). The p-well implanted dose can be further increased to maintain a charge balance, which leads to an Rdson reduction.

21 Claims, 3 Drawing Sheets

ENHANCED HVPMOS

CROSS-REFERENCE TO RELATED APPLICATION

This application is a continuation of U.S. patent application Ser. No. 12/851,256, filed Aug. 5, 2010, U.S. Pat. No. 8,217,452, entitled "ENHANCED HVPMOS", the contents of which are incorporated herein by reference in its entirety.

TECHNICAL FIELD

This subject matter is generally related to semiconductor devices, and more particularly to p-channel lateral double diffused metal-oxide-semiconductor (LDMOS) for high voltage applications.

BACKGROUND

P-channel LDMOS is widely used as high side power devices due to reduced gate drive circuitry. When combined with n-channel LDMOS, p-channel LDMOS can be employed in level shifters in many applications such as motor drivers or display panels. A good specific on-state resistance/breakdown voltage (Rdson/BV) trade-off of n-channel LDMOS is possible due to the Reduced SURface Field (RESURF) principal since the handle wafer is grounded and drain forward biased. However, for p-channel LDMOS, the RESURF principle is inhibited because the drain and handle wafer are commonly biased to the same potential.

Some conventional designs have been developed to overcome this issue. In both Bulk and thick film silicon-on-insulator (SOI) technology, the vertical depletion can also be assured with a source metallization or gate polysilicon which acts as a field plate. The presence of the n-type floating layer associated with the field plate defines a double-RESURF effect which leads to a competitive Rdson/BV tradeoff. In a thin film SOI substrate, however, the small active silicon area reduces the possibility to define an n-type floating region without degrading the device Rdson. Consequently, only the effect of the field plate is possible and the doping concentration of the drift region which sustains the voltage has to be lowered, leading to an increase of Rdson.

SUMMARY

A p-channel LDMOS device with a controlled n-type buried layer (NBL) is disclosed. Shallow trench isolation (STI) oxidation is defined, partially or totally covering the drift region length. The NBL layer, which can be defined with a p-well mask, connects to the n-well diffusion, thus providing an evacuation path for electrons generated by impact ionization. High immunity to the Kirk effect is achieved, resulting in a significantly improved safe-operating-area (SOA). The addition of the NBL deep inside the drift region supports a space-charge depletion region which increases the RESURF effectiveness, thus improving BV. An optimum NBL implanted dose can be set to ensure fully compensated charge balance among n and p doping in the drift region (charge balance conditions). Since the drift depletion action is enhanced with the addition of the NBL layer, the p-well implanted dose can be further increased to maintain a charge balance, which leads to an Rdson reduction.

The p-channel LDMOS with additional NBL improves the BV versus Rdson trade-off in p-channel LDMOS transistors and consumes less surface area, resulting in lower cost transistors.

DETAILED DESCRIPTION

Figure 1:
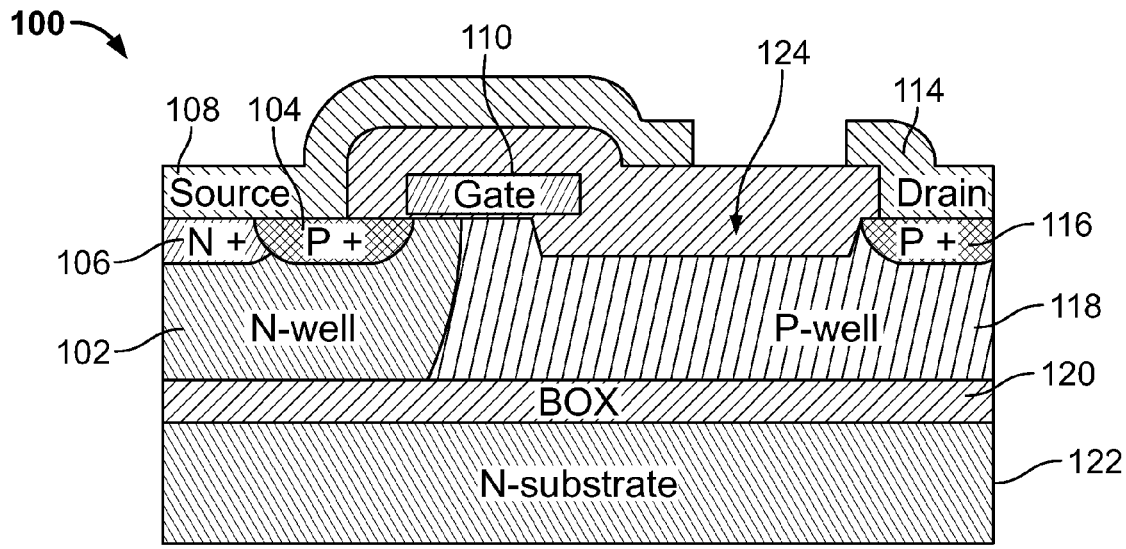
FIG. 1 is a cross sectional view showing the structure of a conventional p-channel LDMOS device.

FIG. 1 is a cross sectional view showing the structure of a conventional p-channel LDMOS 100. LDMOS 100, which is an SOI LDMOS, includes substrate 122, buried oxide layer (BOX) 120, n-well region 102, p-well region 118, n-doped active region 106, p-doped active regions 104, 116, source 108, gate 110 and drain 114.

BOX 120 (e.g., SiO2) is formed in substrate 122 using, for example, a Separation by IMplantation of OXygen process (SIMOX). Substrate 122 can include a semiconductor material such as silicon (Si) or silicon-germanium (SiGe). In this example, substrate 122 is doped with n-type impurities.

P-channel LDMOS 100 is fabricated in n-type substrate 122. An n-doped layer is formed in substrate 122 as n-well region 102, and a p-doped layer is formed inside n-well region 102 forming drift region 118 (hereinafter also referred to as p-well region 118). N-well region 102 and drift region 118 can be formed in substrate 122 overlying BOX 120 using implantation and photoresist masks. Some examples of n-type impurities are Phosphorous and/or Arsenic. Likewise, drift region 118 can be implanted with a p-type impurity using a photoresist mask. Some examples of p-type impurities are Boron and/or Indium. Drift region 118 is laterally adjoining n-well region 102.

N-doped active region 106, which forms an n-well contact region, can be formed in n-well region 102 using implantation and a photoresist mask. N-well 102 is connected to source 108 terminal through n-doped active region 106 to avoid the activation of inherent parasitic bipolar transistor activation by short-circuiting n-well region 102.

P-doped active region 104, which forms a contact region for source 108, is formed in n-well region 102 using implantation and a photoresist mask. N-doped active region 106 and p-doped region 104 can be connected together at the same potential. P-doped active region 116, which forms a contact region for drain 114, can be formed in p-well region 118 using implantation and a photoresist mask.

Source 108 at least partially overlies n-doped active region 106 and p-doped active region 104. Gate 110 at least partially overlies p-doped active region 104 and n-well region 102. Gate 110 can include doped polysilicon disposed in one or more layers of dielectric material (e.g., silicon oxide) or other known conductive materials. Drain 114 at least partially overlies p-doped region 116. A shallow trench isolation (STI) oxidation 124 spaces drain 114 and gate 110 apart, so that a high drain-to-gate voltage can be applied. Electrodes of conductive material can be disposed on source 108, drain 114 and gate 110.

Gate 110 can be used to induce a field-enhanced depletion region between source 108 and drain 114, and thereby creating a "channel." Channel current can be controlled by a vertical electric field induced by gate 110 and a lateral field that exists between source 108 and drain 114.

P-channel LDMOS 100 has a low optimal drift doping concentration which leads to a high Rdson, as compared to an n-channel LDMOS. To optimize the BV and improve the Rdson/BV trade-off of the p-channel LDMOS 100 structure, a new drift region design is needed that includes an NBL, as described in reference to FIG. 2.

Figure 2:
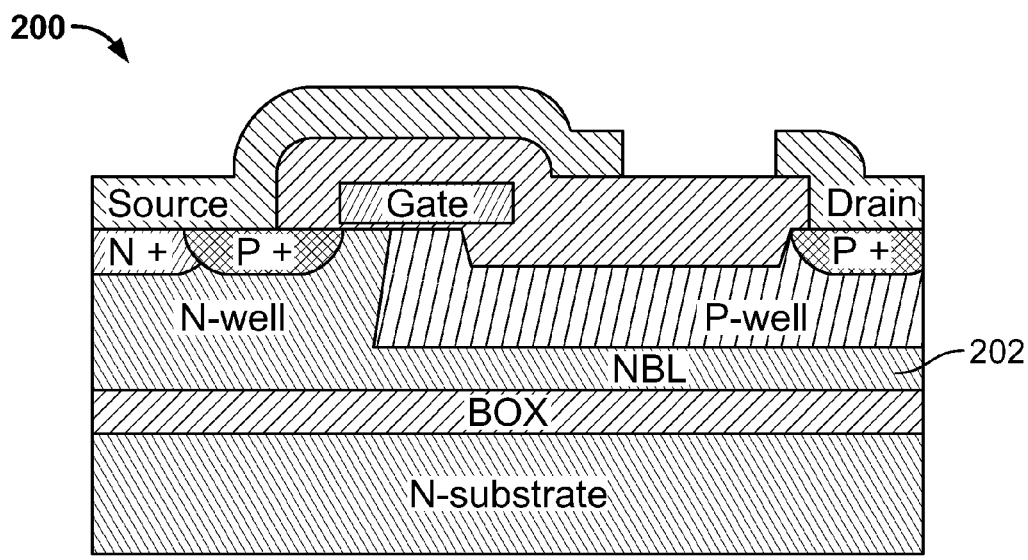
FIG. 2 is a cross sectional view showing the structure of a p-channel LDMOS device, including an NBL.

FIG. 2 is a cross sectional view showing the structure of a p-channel LDMOS device 200, including an NBL 202. P-channel LDMOS 200 has the same structure as p-channel LDMOS 100 except for the inclusion of NBL 202.

In some implementations, NBL 202 can be included in substrate 122 using a high-energy Phosphorus and Boron multi-implantation sequence. NBL 202 can be underlying p-well region 104 and vertically adjoining BOX 120. STI 124 can be previously defined in substrate 122, partially or totally covering the length of drift region 118. STI 124 can be defined by the following process steps: stack deposition (oxide+protective nitride), lithography print, dry etch, trench fill with oxide, chemical-mechanical polishing of the oxide, removal of the protective nitride and adjusting the oxide height.

NBL 202 can be defined with a p-well mask, so that it connects to n-well diffusion, thus providing an evacuation path for electrons generated by impact ionization. NBL 202 provides high immunity to the well-known Kirk effect, thus significantly improving the safe-operating area (SOA). The addition of NBL 202 deep inside drift region 118 supports a space-charge depletion region which increases the RESURF effectiveness, thus improving BV. An optimal NBL 202 implanted dose can be set to ensure full depletion before breakdown, thus achieving good reliability conditions with a compensated charge balance among n and p doping in drift region 118 (charge balance conditions). Since the drift depletion action is enhanced with the addition of NBL 202, the p-well implanted dose can be further increased to maintain charge balance, which leads to Rdson reduction.

Figure 3:
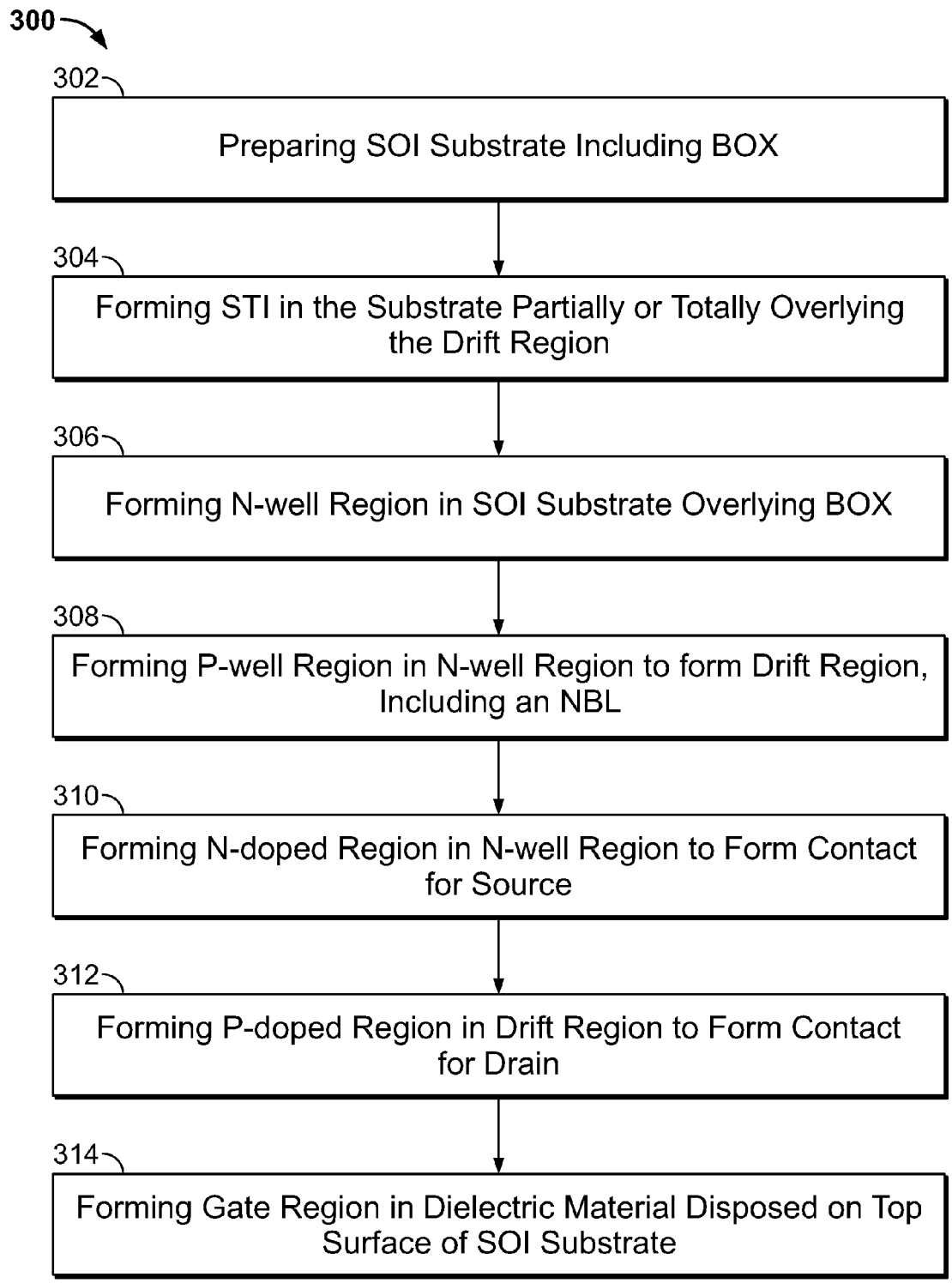
FIG. 3 is a flow diagram of a process for fabricating the p-channel LDMOS of FIG. 2.

FIG. 3 is a flow diagram of a process 300 for fabricating the p-channel LDMOS of FIG. 2. In some implementations, process 300 can begin by preparing an SOI substrate including a BOX (302). The SOI substrate can be prepared using SIMOX, for example. STI is formed in the substrate partially or totally overlying the drift region (304). An n-well region is formed in the SOI substrate, so that the n-well region is vertically adjoining the BOX (306). A p-well region is formed in the n-well region to provide a drift region including an NBL disposed between the BOX and the drift region (308). The NBL is laterally connected to the n-well region to provide an evacuation path for electrons generated by impact ionization. An n-doped region is formed in the n-well region to form a contact region for a source (310). A p-doped region is formed in the drift region to form a contact region for a drain (312). A gate is formed in dielectric material disposed on the top surface of the SOI substrate so that the gate region at least partially overlies the n-well region and the drift region, defining a channel (314). In some implementations, electrodes formed from conductive material can be disposed on the source, gate and drain, respectively, using a metallization process.

Figure 4:
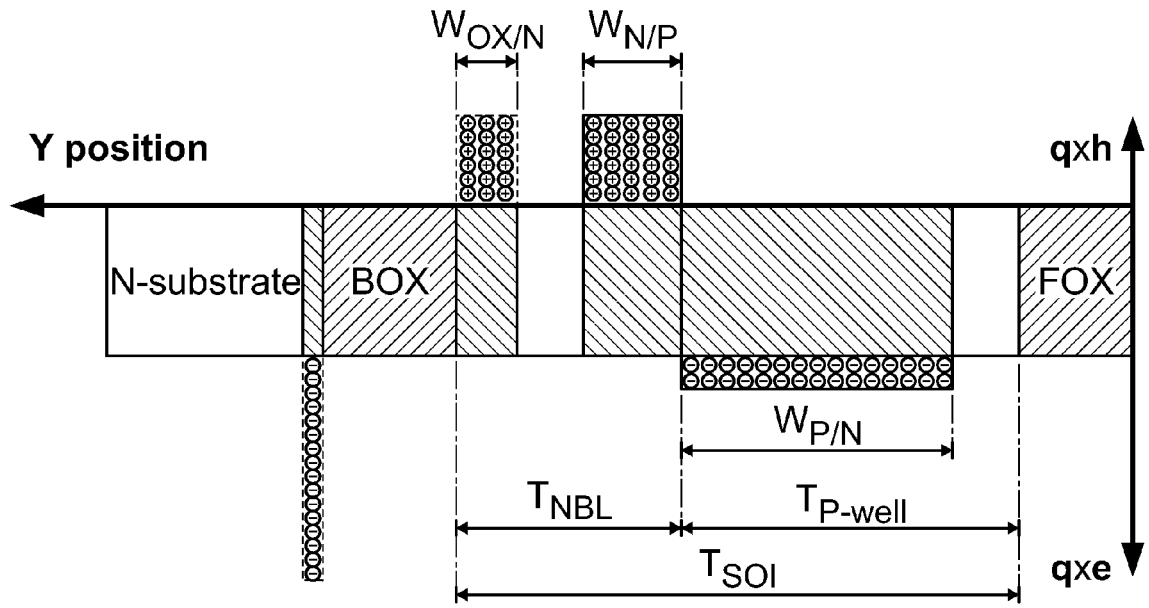
FIG. 4 is a schematic diagram illustrating charge distribution along a Silicon/BOX/Silicon drift region in the proposed p-channel LDMOS structure.

FIG. 4 is a schematic diagram illustrating charge distribution along the Silicon/BOX/Silicon region in the proposed p-channel LDMOS structure. For example, in thin film SOI substrates with a Silicon active thickness ($T_{SOI}$) of 1.6 um, NBL 202 thickness ($T_{NBL}$) can be made as small as possible to not excessively reduce the drift current path which could penalize Rdson. As shown in FIG. 4, NBL 202 is depleted by the combined action of substrate field-effect action, and the p-well/NBL junction. Then, the optimal NBL implanted charge can be appropriately chosen to compensate both depletion effects. Hence, the total depletion process in NBL 202 can be defined by $$W_{NBL} = W_{N/P} + W_{ox/N},\qquad [1]$$

where $W_{N/P}$ is the depletion region in NBL 202 due to the p-well/NBL junction diode represented by $$W_{N/P} = \sqrt{\frac{2\cdot\varepsilon_{si}}{q\cdot NBL\left(1+\frac{N_{NBL}}{N_{pwell}}\right)}(V_D - V_{bi})} \approx \sqrt{\frac{\varepsilon_{si}\cdot V_D}{q\cdot N_{NBL}}},\qquad [2]$$

where $N_{NBL}$ and $N_{pwell}$ are the constant doping concentration of the NBL and p-well layers, respectively, and $W_{ox/N}$ is the depletion region in NBL 202 due to the SOI substrate field effect action, defined by $$W_{ox/N} = \frac{\varepsilon_{si}\cdot\varepsilon_{ox}\cdot V_D}{q\cdot N_{NBL}\cdot(\varepsilon_{si}\cdot T_{BOX} + \varepsilon_{ox}\cdot T_{NBL})},\qquad [3]$$

where $\varepsilon_{si}$ is the dielectric constant of Silicon, $\varepsilon_{ox}$ is the dielectric constant of oxide, q is the electronic charge, $V_{bi}$ is the built-in potential, $V_D$ is the threshold voltage and $T_{BOX}$ is the thickness of the BOX.

In optimal RESURF conditions, the vertical full depletion of the NBL region has to take place before the junction breakdown. The voltage capability of a planar junction in a lateral diode is given by:

$$V_{BR}^{Ld} = \frac{\varepsilon_{si}\cdot E_c^2}{2\cdot q\cdot N_{NBL}},\qquad [4]$$

where $\varepsilon_{si}$ is the dielectric constant of Silicon and $E_c$ is the Silicon critical electric field ($\approx 3\times 10^5$ V/cm). Then, if the planar breakdown expression [4] is introduced into expression [1], and the theoretical bound in 1D-RESURF theory is considered by setting $N_{NBL} = N_{pwell}$ in expression [2], then the $W_{NBL}$ can be simplified to the following expression:

$$W_{NBL} = \frac{2\times 10^{12}}{N_{NBL}}\left(\sqrt{\frac{1}{2}} + \frac{1\times 10^{12}}{N_{NBL}}\cdot\frac{\varepsilon_{ox}}{(\varepsilon_{si}\cdot T_{BOX} + \varepsilon_{ox}\cdot T_{NBL})}\right).\qquad [5]$$

Figure 5:
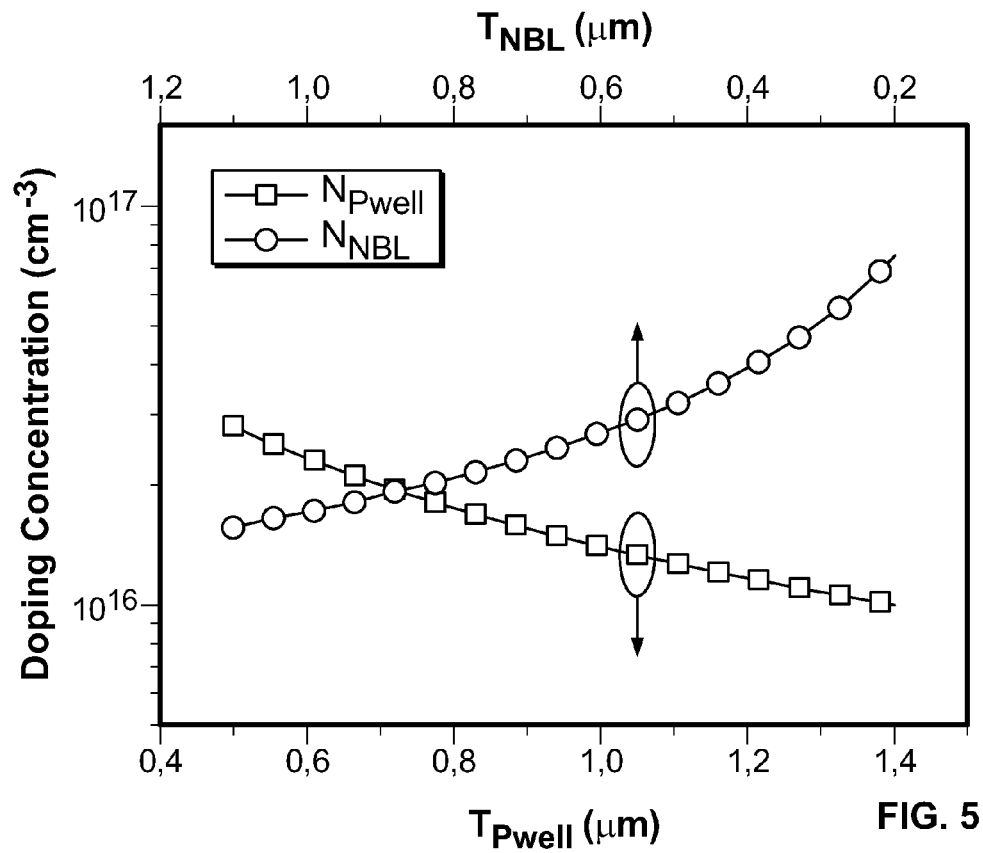
FIG. 5 is a graph of calculated constant doping concentration in the p-well and NBL layers as a function of the p-well ($T_{pwell}$) and NBL ($T_{NBL}$) thickness.

FIG. 5 is a graph of calculated constant doping concentration in the p-well and NBL layers as a function of p-well ($T_{pwell}$) and NBL ($T_{NBL}$) thickness. The theoretical drift resistances ($R_{LDD}$) can be extracted from $$R_{LDD} = \frac{1}{q\cdot N_{pwell}\cdot\mu_p}\cdot\left(\frac{L_{LDD}}{T_{Active}\cdot W}\right),\qquad [6]$$

where $L_{LDD}$ is the drift region and $T_{Active} = T_{SOI} - (T_{NBL} - W_{P/N})$ in the proposed p-channel LDMOS, and the depletion region in the p-well layer, $W_{P/N}$, expressed as:

$$W_{P/N} = \sqrt{\frac{\varepsilon_{si} \cdot V_{bi}}{q \cdot N_{pwell}}}.\qquad[7]$$

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

What is claimed is:

1. A semiconductor device, comprising:
    a substrate;
    a buried oxide layer on the substrate;
    an N-well region overlying the buried oxide layer;
    a P-well region partially laterally adjoining the N-well region and forming a drift region; and
    an N-type buried layer (NBL) overlying the buried oxide layer and disposed between the drift region and the buried oxide layer, the NBL laterally connected to the N-well region.

2. The semiconductor device of claim 1, comprising:
    an N-doped active region formed in the N-well region;
    a first P-doped active region formed in the N-well region; and
    a second P-doped active region formed in the drift region.

3. The semiconductor device of claim 2, comprising:
    a source at least partially overlying the N-doped active region and the first P-doped active region;
    a gate at least partially overlying the first P-doped active region and the N-well region; and
    a drain at least partially overlying the second P-doped active region.

4. The semiconductor device of claim 3, comprising:
    a shallow trench isolation (STI) oxidation at least partially covering a length of the drift region and spacing the drain and gate apart.

5. The semiconductor device of claim 3, comprising electrodes of conductive material disposed on at least one of the source, the drain and the gate.

6. The semiconductor device of claim 1, wherein the substrate includes a semiconductor material that is selected from a group consisting of silicon and silicon-germanium.

7. The semiconductor device of claim 1, wherein an amount of P-well implanted dose in the NBL is configured to provide full depletion before breakdown.

8. The semiconductor device of claim 7, wherein the amount of P-well implanted dose is configured to maintain a compensated charge balance among N-type and P-type doping in the drift region.

9. The semiconductor device of claim 8, wherein an amount of NBL implanted charge is configured to compensate an NBL depletion effect associated with substrate field-effect action, and an NBL depletion effect associated with a junction of the drift region and the NBL.

10. A method comprising:
    preparing a silicon-on-insulator (SOI) substrate that includes a buried oxide layer;
    forming a shallow trench isolation (STI) in the SOI substrate;
    forming an N-well region in the substrate overlying the buried oxide layer;
    generating a drift region laterally adjoining the N-well region by forming a P-well region in the N-well region; and
    forming an N-type buried layer (NBL) that is overlying the buried oxide layer and disposed between the drift region and the buried oxide layer, the NBL laterally connected to the N-well region.

11. The method of claim 10, wherein generating the drift region comprises generating the drift region such that the STI is at least partially overlying the drift region.

12. The method of claim 10, comprising:
    forming an N-doped active region in the N-well region;
    forming a first P-doped active region in the N-well region; and
    forming a second P-doped active region in the drift region.

13. The method of claim 12, comprising:
    forming a source at least partially overlying the N-doped active region and the first P-doped active region;
    forming a gate at least partially overlying the first P-doped active region and the N-well region; and
    forming a drain at least partially overlying the second P-doped active region.

14. The method of claim 10, wherein preparing the SOI substrate that includes the buried oxide layer comprises forming the buried oxide layer in the SOI substrate using Separation by Implantation of Oxygen process (SIMOX).

15. The method of claim 10, wherein forming the N-well region comprises:
    implanting the substrate with an N-type impurity using a photoresist mask, the N-type impurity selected from the group consisting of Phosphorous and Arsenic.

16. The method of claim 10, wherein forming the P-well region comprises:
    implanting the substrate with a P-type impurity using a photoresist mask, the P-type impurity selected from the group consisting of Boron and Indium.

17. The method of claim 10, wherein forming the NBL comprises:
    forming the NBL in the substrate using a high-energy Phosphorus and Boron multi-implantation sequence.

18. The method of claim 10, wherein forming the NBL comprises using P-well mask.

19. The method of claim 18, comprising:
    selecting an amount of P-well implanted dose for providing full depletion before breakdown.

20. The method of claim 19, wherein selecting the amount of P-well implanted dose comprises:
    selecting the amount of P-well implanted dose for maintaining a compensated charge balance among N-type and P-type doping in the drift region.

21. The method of claim 10, wherein forming the NBL comprises:
    selecting an amount of NBL implanted charge for compensating an NBL depletion effect associated with substrate field-effect action, and an NBL depletion effect associated with a junction of the drift region and the NBL.

* * * * *